United States Patent [19]

Mima et al.

[11] Patent Number: 4,919,217

[45] Date of Patent: Apr. 24, 1990

[54] OPTICAL FIBER-CONTAINING INSULATORS AND PRODUCING PROCESS THEREOF

[75] Inventors: Toshiyuki Mima; Hideki Shimizu, both of Nagoya, Japan

[73] Assignee: NGK Insulators, Ltd., Japan

[21] Appl. No.: 368,595

[22] Filed: Jun. 20, 1989

[30] Foreign Application Priority Data

Aug. 10, 1988 [JP] Japan .................... 63-197829

[51] Int. Cl.$^5$ ............. H01B 17/00; G02B 6/00
[52] U.S. Cl. .................. 174/139; 29/631
[58] Field of Search ........... 174/139; 29/631; 65/36; 350/320

[56] References Cited

U.S. PATENT DOCUMENTS 4,810,836  3/1989  Shinoda et al. ............... 174/139

FOREIGN PATENT DOCUMENTS 56-118217  9/1981  Japan ............. 174/139
60-158402  8/1985  Japan ............. 174/139

Primary Examiner—Laramie E. Askin
Attorney, Agent, or Firm—Arnold, White & Durkee

[57] ABSTRACT

An optical fiber-containing insulator including an insulator body having a through hole provided in a central portion thereof, an optical fiber inserted into the through hole, a stepped portion formed in the through hole at at least one end of the insulator body, a sealing section consisting of a pair of holders provided at upper and lower ends of the stepped portion, an inorganic glass layer sandwiched between the holders, and a protective layer formed on the outer holder. A process for producing such an optical fiber-containing insulator is also disclosed.

2 Claims, 5 Drawing Sheets

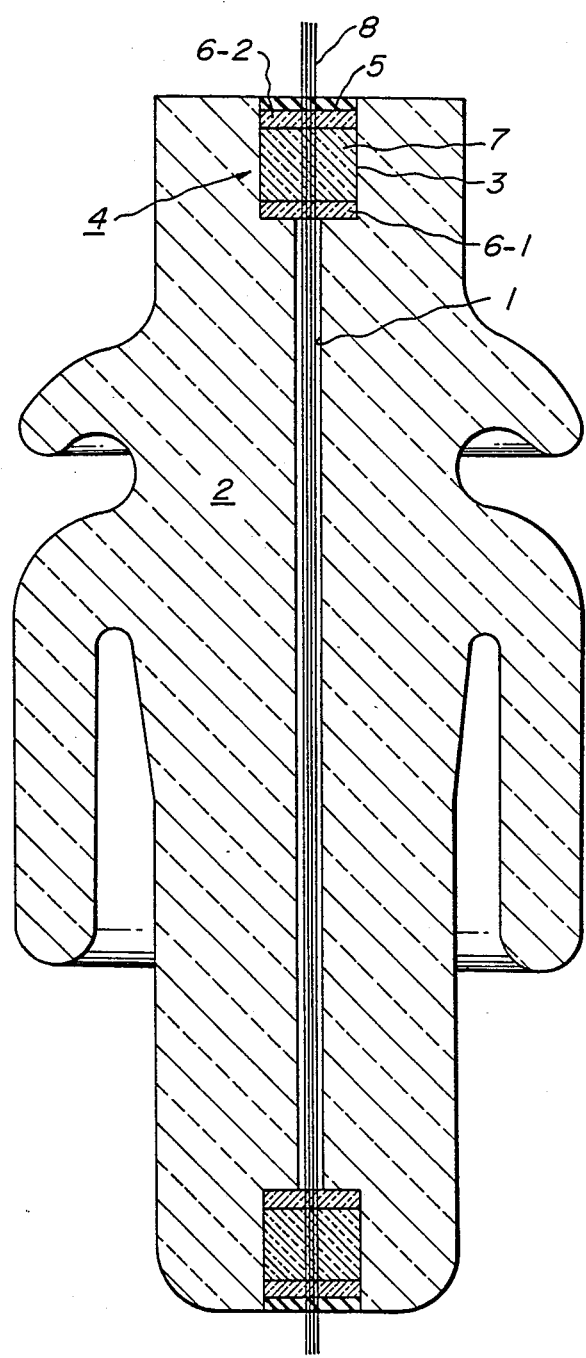
FIG_1

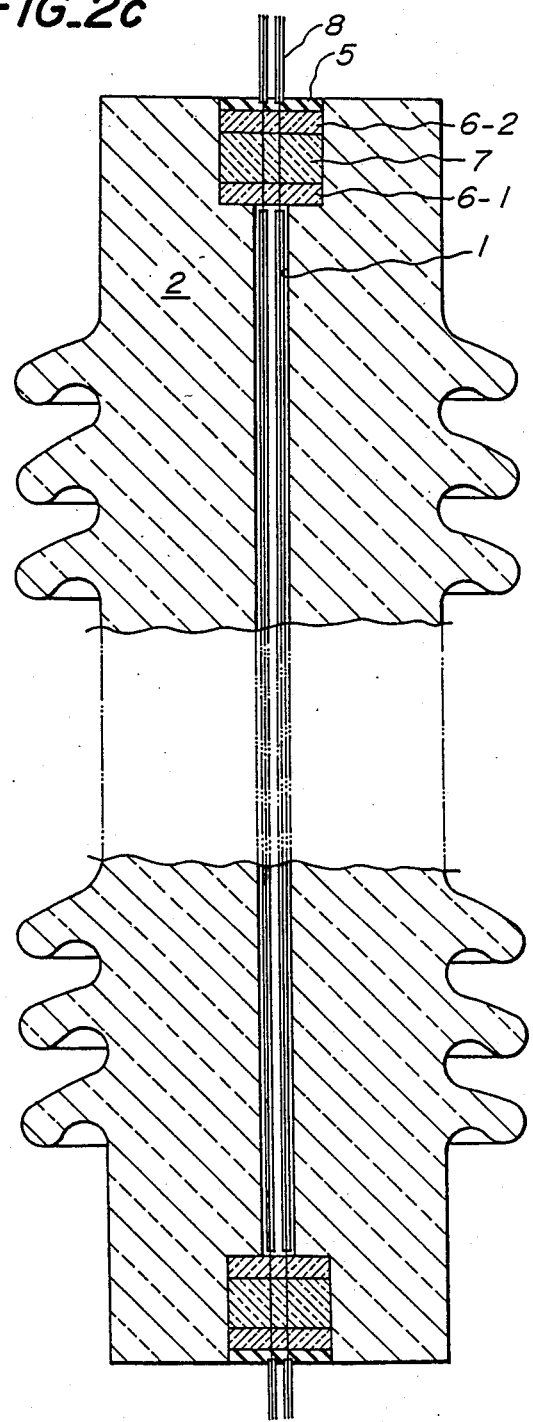

OPTICAL FIBER-CONTAINING INSULATORS AND PRODUCING PROCESS THEREOF

BACKGROUND OF THE INVENTION

1 Field of the Invention

The present invention relates to optical fiber-containing insulators to be mainly used for the formation of fault-localizing systems in power transmission networks and substations, and also to a producing process thereof.

2 Related Art Statement

In order to automatically localize faults in electric power systems, optical fiber-containing insulators have conventionally been used, which possess a function to transmit signals from optical sensors on a charging side to localizers on an earthed side.

FIG. 3 is a view illustrating a structural example of a voltage-current detecting system utilizing a conventional optical fiber-containing insulator. In FIG. 3, optical signals from a voltage sensor 21 and an electric current sensor 22 are transmitted to a localizer 27 through optical fibers 24-1 and 24-2 in the optical fiber-containing insulator 23, connectors 25-1 and 25-2, and couplers 26-1 and 26-2.

In this detecting system, the conventional optical fiber-containing insulator 23 is used in the state that the bared optical fibers 24-1 and 24-2 are entirely placed and sealed in an inner hole of the insulator with inorganic glass, and that opposite end faces of the insulator are finely polished to a mirror finish. The voltage sensor 21 and the current sensor 22 are bonded to the end faces through quartz ferrules 28-1 and 28-2, respectively, by using an epoxy resin. On the other hand, the optical fibers 29-1 and 29-2 on the side of the localizer 27 are bonded to the other end faces of the optical fibers through alumina ferrules 30-1 and 30-2 by using such an epoxy resin.

In the above-mentioned conventional optical fiber-containing insulator 23, the opposed end faces of the insulator containing the optical fibers must not only be mirror-polished, but also the covered optical fibers must be connected to the bared optical fibers by using the ferrules from a structural point of view. Consequently, it may be that light transmission loss occurs at the ferrule-bonded portion, and that adhesion at the ferrule-bonded portion is not sufficient. Thus, the above insulator is not satisfactory with respect to the increased number of steps and reliability.

Further, it is structurally difficult to form a plurality of optical fiber-passing paths in the conventional optical fiber-containing insulator 23, and two light-transmitting paths only can be formed therein. Therefore, since a single light-transmitting path needs to be used commonly for a light-emitting system and a light-receiving system, expensive couplers 26-1 and 26-2 need to be used for light separation. Consequently, the entire system becomes expensive.

SUMMARY OF THE INVENTION

It is an object of the present invention to solve the above-mentioned problems, and to provide optical fiber-containing insulators and a producing process thereof, characterized in that optical fibers which are sealingly fixed in an insulator with inorganic glass while the fibers are projected from an end of the insulator are connected to other optical fibers extended from another system by a technique such as fusing to improve reliability of the optical fibers at the end portion of the insulator. Accordingly, the entire system can be made less expensive without using expensive ferrules or couplers.

The optical fiber-containing insulator according to the present invention passes optical fibers through a through hole formed in a central portion of the insulator, and is characterized by comprising a stepped portion formed in the through hole at at least one of the end portions of the insulator, a sealing section which has an inorganic glass layer sandwiched between a pair of holders provided at upper and lower ends of the stepped portion, and a protective layer provided on the outer surface of the outer holder.

The process for producing the optical fiber-containing insulators according to the present invention in which optical fibers are passed through a through hole provided in a central portion of the insulator is characterized by comprising the steps of: forming a stepped portion in a through hole at at least one end of the insulator; inserting, into the stepped portion, a sealing section in which an inorganic glass layer is preliminarily shaped in the form of a shaped glass body, and held between a pair of holders; passing a desired number of bared optical fibers through a through hole formed in the sealing section; sealing the optical fibers by softening the inorganic glass by heating while a load is applied downwardly onto the upper holder; and providing a protective layer on the outer holder for the protection of the optical fibers.

In the above construction, since the optical fibers and the peripheral wall of the stepped portion are sealed to each other with the inorganic glass in the sealing section formed in the stepped portion of the through hole at at least one end, preferably at each of the opposite ends, of the insulator, it is possible that a desired number of, for example, four, covered optical fibers are continuously located inside the through hole of the insulator without using ferrules or the like. That is, a sealing section in which the covering of the optical fibers needs to be bared is limited to the holders and the sealing section of the inorganic glass in the stepped portion, and the protective layer made of a material such as silicone rubber is provided on the outer side of the sealing section. Therefore, unlike in the conventional articles, mirror polishing of the end faces is unnecessary, and optical fibers which do not require ferrules and which are not susceptible to bending or breakage at the end portions can be obtained.

In order to obtain the optical fiber-containing insulators having the above-mentioned structure, an inner one of a pair of holders is fitted into a stepped portion provided at at least one end or at each of opposite ends of the insulator, a preliminarily shaped glass body made of inorganic glass is inserted, and then the other outer holder is placed thereon to form a sealing section. Alternatively, a sealing section in which inorganic glass is interposed and integrally fused between a pair of holders is formed and inserted into a stepped portion. Then, optical fibers are inserted into through holes formed in the sealing section and the insulator and the optical fibers are favorably sealed to the stepped portion with the inorganic glass in the sealing section by heating while a load is applied downwardly onto the sealing section to give a plane pressure of a few g/cm$^2$ to dozens of g/cm$^2$. In this case, since the optical fibers are entirely exposed to the softening temperature of the inorganic glass, the covering layers of the optical fibers need to have heat resistance. Further, the holder is preferably a sintered body or a calcined body of the same material as that of a body for the insulator.

These and other objects, features and advantages of the invention will be appreciated upon reading of the following description of the invention when taken in conjunction with the attached drawings, with the understanding that some modifications, variations and changes of the same could be made by the skilled person in the art to which the invention pertains without departing from the spirit of the invention or the scope of claims appended hereto.

BRIEF DESCRIPTION OF THE ATTACHED DRAWINGS

For a better understanding of the invention, reference is made to the attached drawings, wherein:

FIG. 1 is a sectional view illustrating the structure of an optical fiber-containing insulator according to the present invention;

FIGS. 2a through 2c are views showing steps for producing the optical fiber-containing insulator having the structure shown in FIG. 1.

DETAILED DESCRIPTION OF THE INVENTION

Figure 2A:
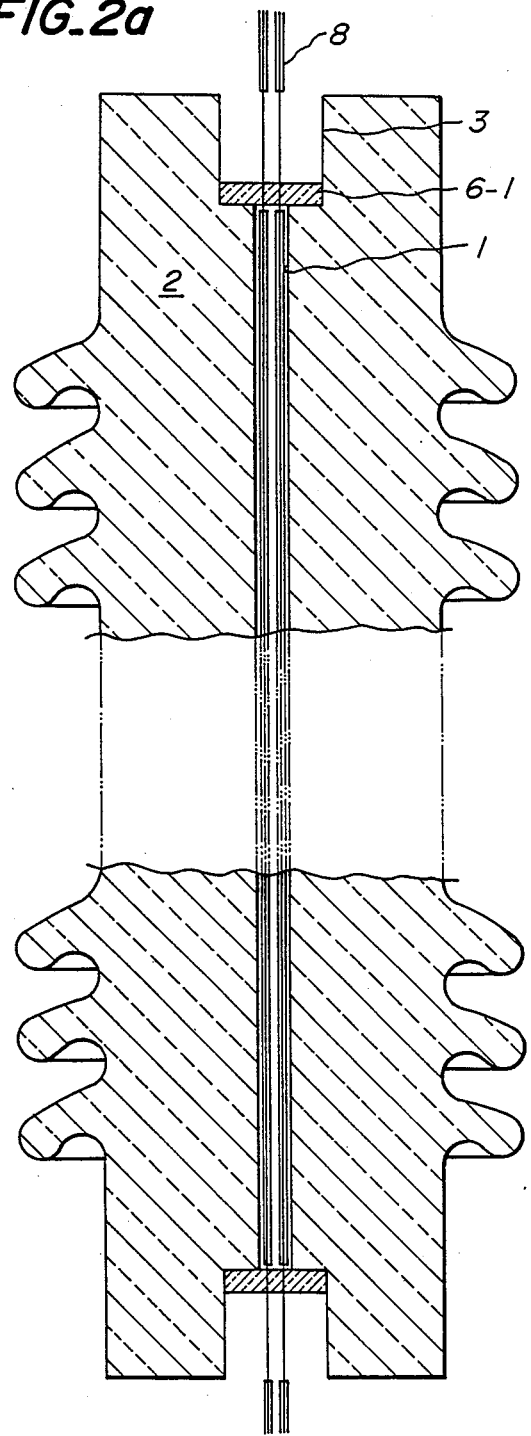

The present invention will be explained in more detail with reference to the attached drawings.

FIG. 1 is a view showing by way of example the structure of stepped portions provided at the ends of a through hole of an optical fiber-containing insulator according to the present invention. In this embodiment, the insulator 2 has a through hole 1 through which at least a desired number of optical fibers 8 are insertable, a stepped portion 3 is formed in each end portion of the through hole, a sealing section 4 is provided in each stepped portion 3, and a protective layer 5 made of a material such as rubber is provided on the outer side of each sealing section 4. The sealing section 4 has almost the same sectional shape as that of the stepped portion 3, and is constituted by calcined holders 6-1 and 6-2 preferably composed of the same material as that of the insulator 2, and an inorganic glass layer 7 placed between the calcined holders 6-1 and 6-2 for sealing the optical fibers to the insulator 2.

Figure 2B:
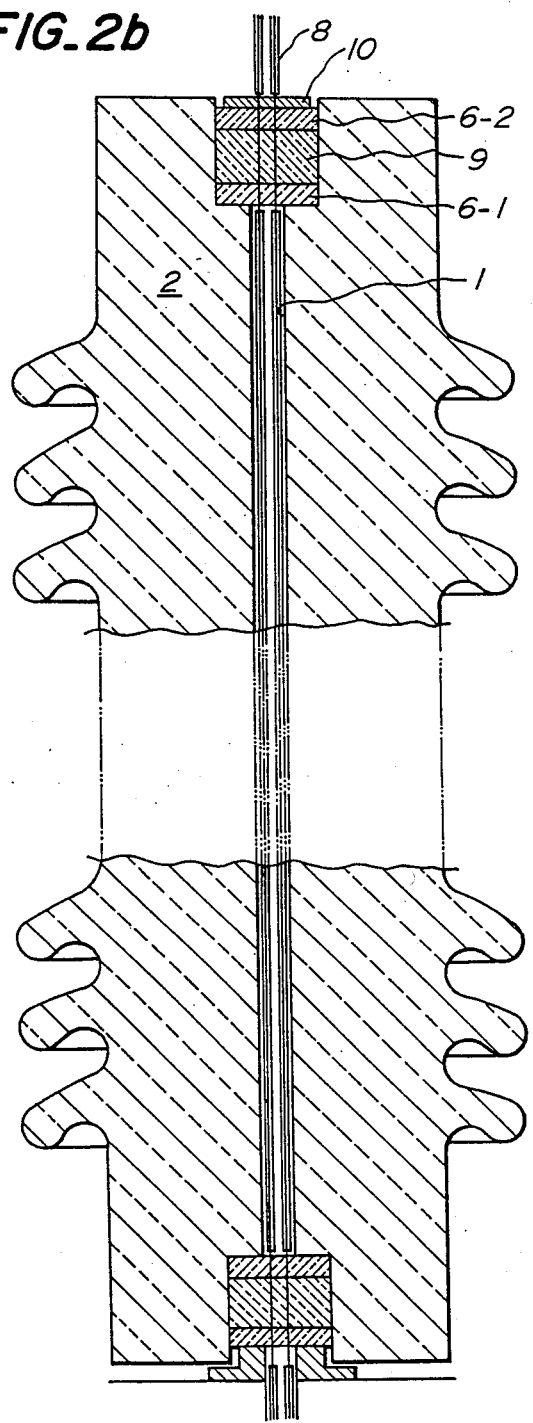

FIGS. 2a through 2c are views illustrating by way of example steps of producing the optical fiber-containing insulator constituted as shown in FIG. 1. As shown in FIG. 2a, a lower calcined holder 6-1 having holes for passing optical fibers at a central portion is first fitted into a stepped portion 3 formed at an end portion of a through hole 1 of an insulator 2, and a desired number of optical fibers 8 are fitted into the through hole 1 and the holes of the calcined holder 6-1. In this case, the covering of each of the optical fibers 8 is preliminarily bared over the same length as the thickness of the sealing section 4 so that the bared portion of the optical fiber 8 may be positioned in the sealing section 4. Each of the calcined holders 6-1 and 6-2 is preliminarily prepared by shaping a body to be also used for the insulator in the form shown in FIG. 2a and calcining it at a given temperature. Next, as shown in FIG. 2b, a shaped glass body 9 of inorganic glass having optical fiber-passing holes at the central portion is placed on the calcined holder 6-1 preferably in the state that a glass paste is interposed between the shaped glass body 9 and the stepped portion 3 and the calcined holders 6-1 and 6-2. Then, after the calcined holder 6-2 is placed on the shaped glass body 9, a weight 10 made of, for example, a stainless steel cylinder, having a given weight, is placed on the calcined holder 6-2. In order to reduce shrinkage of the shaped glass body on sealing, it is preferable that the shaped glass body is preliminarily shrunk by press shaping and heat treatment such as calcining so that only a small space may be given between the shaped glass body and the stepped portion 3. In the above assembled state, the assembly is heated at a given temperature in open air or preferably in vacuum to form an inorganic glass layer 7 (FIG. 2c). Finally, as shown in FIG. 2c, the optical fiber-containing insulator is obtained by arranging silicone rubber around the optical fibers on the calcined holder 6-2, and consequently, forming a protective layer 5 thereon.

Next, actual examples of the present invention will be explained below.

EXPERIMENT 1

Figure 3:
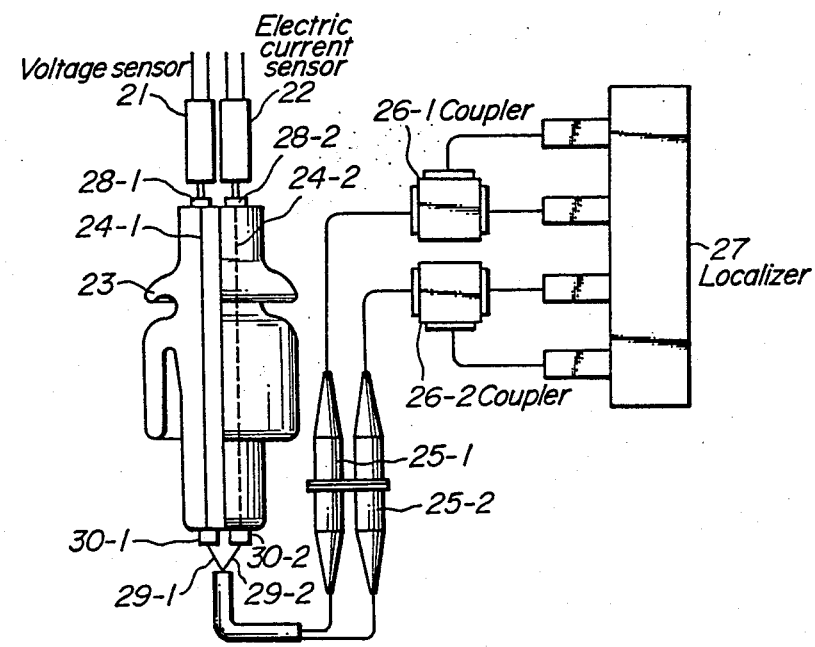
FIG. 3 is a view showing by way of example the construction of a voltage-current locating system utilizing the conventional optical fiber-containing insulator.

Each of optical fiber-containing insulators within the scope of the present invention, and as comparative examples and conventional examples shown in FIG. 3 outside the scope of the invention was produced under glass-sealing conditions in Tables 1(a) and 1(b) according to the above producing process by using an optical fiber-covering material shown in Tables 1(a) and 1(b). Each of the insulators had a respective end structure at one end. An ultraviolet ray curable type resin which was free from reduction in bending strength by heat treatment at 400° C. for 2 hours or more was used as a heat-resisting resin. A low melting point glass having a softening point of 350° C. was used as a sealing glass.

With respect to end portions of the thus produced optical fiber-containing insulators as invention products and comparative and conventional examples, defect-discovering tests were conducted by using a fluorescent penetrant inspection to observe the sealing state between the inorganic glass layer and the stepped portion of the insulator, and light transmittance was visually judged. The insulators having better, equal and worse results as compared with the conventional products shown in FIG. 3 were evaluated as O, Δ, and x, respectively. Results are shown in Table 1.

TABLE 1

|  |  |  | Glass-sealing conditions | | | | Evaluation | | | |
|---|---|---|---|---|---|---|---|---|---|---|
|  |  |  | Pellet-calcining temperature (°C.) | Sealing conditions | | | | Light transmittance of optical fiber | Total evaluation | Remarks |
|  |  | Optical fiber-covering material |  | Sealing temperature (°C.) | Sealing time (hr) | Load (g/cm$^2$) | Bonded state |  |  |  |
| Present invention | 1 | heat-resisting resin | 360 | 420 | 1.0 | 40 | O | O | O |  |
|  | 2 | heat-resisting resin | 360 | 420 | 1.0 | 10 | O | O | O |  |
|  | 3 | heat-resisting resin | 360 | 400 | 1.0 | 15 | O | O | O |  |
|  | 4 | heat-resisting resin | 360 | 400 | 1.5 | 6 | O | O | O |  |
|  | 5 | heat-resisting resin | 360 | 400 | 1.0 | 38 | O | O | O |  |

TABLE 1-continued

|  |  | Optical fiber-covering material | Glass-sealing conditions | | | | Evaluation | | | Remarks |
|---|---|---|---|---|---|---|---|---|---|---|
|  |  |  | Pellet-calcining temperature (°C.) | Sealing conditions | | | Bonded state | Light transmittance of optical fiber | Total evaluation |  |
|  |  |  |  | Sealing temperature (°C.) | Sealing time (hr) | Load (g/cm²) |  |  |  |  |
|  | 6 | heat-resisting resin | 350 | 400 | 1.0 | 15 | O | O | O |  |
|  | 7 | heat-resisting resin | 340 | 400 | 1.0 | 32 | O | O | O |  |
|  | 8 | heat-resisting resin | 360 | 380 | 1.0 | 65 | O | O | O |  |
|  | 9 | heat-resisting resin | 360 | 380 | 1.5 | 50 | O | O | O |  |
|  | 10 | heat-resisting resin | 350 | 380 | 1.5 | 32 | O | O | O |  |
|  | 11 | heat-resisting resin | 340 | 380 | 1.0 | 65 | O | O | O |  |
|  | 12 | heat-resisting resin | 360 | 400 | 1.0 | 6 | O | O | O |  |
| Conventional Example | 1 | no | — | 500 | 1.0 | — | O | O | Δ | Optical polishing of end faces necessary after bonding |
|  | 2 | no | — | 480 | 3.0 | — | O | O | Δ |  |
| Comparative Example | 1 | silicone resin | 360 | 420 | 1.0 | 40 | O | X | X | optical fiber break down |
|  | 2 | silicone resin | 360 | 380 | 1.0 | 40 | X | X | X | optical fiber break down |
|  | 3 | silicone resin | 360 | 350 | 1.0 | 40 | X | O | X |  |
|  | 4 | heat-resisting resin | 360 | 420 | 1.0 | 0 | X | O | X |  |
|  | 5 | heat-resisting resin | 360 | 460 | 1.0 | 0 | X | O | X |  |
|  | 6 | heat-resisting resin | 360 | 480 | 1.0 | 0 | X | X | X | optical fiber break down |

From the results in Tables 1(a) and 1(b), it is seen that the insulators using the silicone resin as the optical fiber-covering material (Comparative Examples 1 to 3) exhibited inferior evaluation results compared to the invention products, even when a load was applied, and that the insulators which used the heat resisting material as the covering material and which were heated under no application of a load (Comparative Examples 4 through 6) exhibited poorer results as compared with the invention products.

The present invention is not limited to the above-mentioned examples only, and various modifications, variations and changes are possible. For instance, although only one end of the insulator need be designed in the intended shape, it is clear that an insulator having such an end structure at each of opposite ends thereof is preferred. Further, although silicone rubber is used as the protective layer 5, a different material such as polyimide or the like may be used.

It is clear from the foregoing explanation that according to the optical fiber-containing insulators and the producing process thereof in the present invention, the optical fiber which continues only at the stepped portion at an end portion, of the through hole formed through the insulator is sealed. Thus, the production step is simplified, reliability is improved, and the cost can be reduced, as compared with the conventional optical fiber-containing insulators.

What is claimed is:

1. An optical fiber-containing insulator comprising an insulator body having a through hole provided in a central portion thereof, an optical fiber inserted into said through hole, a stepped portion formed in the through hole at at least one end of the insulator body, a sealing section consisting of a pair of holders provided at upper and lower ends of the stepped portion and an inorganic glass layer sandwiched between the holders, and a protective layer formed on the outer holder.

2. A process for producing an optical fiber-containing insulator in which an optical fiber is passed through a through hole formed in a central portion of the insulator body, said process comprising the steps of forming a stepped portion in the through hole at at least one end of the insulator, inserting a sealing section into the stepped portion, said sealing section being preliminarily formed by sandwiching an inorganic glass layer in the form of a shaped glass body between a pair of upper and lower holders, passing a desired number of bared optical fibers through one or more through holes formed in the sealing section, sealing the optical fibers by softening the inorganic glass by heating while a load is applied onto the upper holder, and forming an optical fiber-protective layer onto the outer holder.

* * * * *